(12) United States Patent
Kang (10) Patent No.: US 10,998,294 B2
(45) Date of Patent: May 4, 2021

(54) SEMICONDUCTOR PACKAGES HAVING STACKED CHIP STRUCTURE

(71) Applicant: SK hynix Inc., Icheon-si (KR)

(72) Inventor: Min Kyu Kang, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/539,823

(22) Filed: Aug. 13, 2019

(65) Prior Publication Data
US 2020/0251447 A1 Aug. 6, 2020

(30) Foreign Application Priority Data

Feb. 1, 2019 (KR) ........................ 10-2019-0013693

(51) Int. Cl.
| | |
|---|---|
| *H01L 25/065* | (2006.01) |
| *H01L 23/31* | (2006.01) |
| *H01L 23/48* | (2006.01) |
| *H01L 23/00* | (2006.01) |

(52) U.S. Cl.
CPC ...... *H01L 25/0657* (2013.01); *H01L 23/3107* (2013.01); *H01L 23/481* (2013.01); *H01L 24/49* (2013.01)

(58) Field of Classification Search
CPC ................ H01L 24/73; H01L 23/3107; H01L 2225/0651; H01L 24/49; H01L 23/481; H01L 25/0657; H01L 2225/06562; H01L 2225/06548; H01L 23/3128
See application file for complete search history.

(56) References Cited

U.S. PATENT DOCUMENTS

2010/0283140 A1* 11/2010 Kim ................. H01L 23/49811
257/686
2018/0190617 A1 7/2018 Chew

FOREIGN PATENT DOCUMENTS

KR 101069499 B1 9/2011

* cited by examiner

*Primary Examiner* — Jasmine J Clark
(74) *Attorney, Agent, or Firm* — William Park & Associates Ltd.

(57) ABSTRACT

A semiconductor package includes a plurality of stacked first semiconductor chips disposed over a substrate. At least a portion of the plurality of stacked first semiconductor chips is encapsulated in a first mold layer. The semiconductor package also includes a plurality of stacked second semiconductor chips disposed over the topmost chip of the stacked first semiconductor chips and the first mold layer. The semiconductor package also includes a third semiconductor chip disposed over the first mold layer and adjacent to the stacked second semiconductor chips. At least a portion of the third semiconductor chip overlaps with a portion of one or more of the stacked second semiconductor chips.

25 Claims, 9 Drawing Sheets

FIG. 7

SEMICONDUCTOR PACKAGES HAVING STACKED CHIP STRUCTURE

CROSS-REFERENCE TO RELATED APPLICATIONS

The present application claims priority under 35 U.S.C 119(a) to Korean Application No. 10-2019-0013693, filed on Feb. 1, 2019, which is incorporated herein by references in its entirety.

BACKGROUND

1. Technical Field

The present disclosure relates generally to semiconductor packages and, more particularly, to semiconductor packages having a stacked chip structure.

2. Related Art

Compact and highly integrated semiconductor products are developed for high speed processing of large amounts of data. With increasing level of high integration and compactness, the fabrication processes involved in making such a high performance chip become more complex and involve more complicated tasks. Thus, packaging multiple number of semiconductor chips into a single semiconductor package to achieve compactness and high integration while increasing the capacity has been studied and researched in order to improve the data processing performance of an electronic system that utilizes such semiconductor packages.

One development focus deals with improving ways to stack more semiconductor chips on a package substrate in a semiconductor package. For example, a plurality of semiconductor memory chips may be stacked to resemble a stair structure and then packaged into a memory package so as to increase the overall storage capacity of the semiconductor memory package.

SUMMARY

According to an embodiment, there is provided a semiconductor package. The semiconductor package includes a plurality of stacked first semiconductor chips disposed over a substrate. At least a portion of the plurality of stacked first semiconductor chips is encapsulated in a first mold layer. The semiconductor package also includes a plurality of stacked second semiconductor chips disposed over the topmost chip of the stacked first semiconductor chips and the first mold layer. The semiconductor package also includes a third semiconductor chip disposed over the first mold layer and adjacent to the stacked second semiconductor chips. At least a portion of the third semiconductor chip overlaps with a portion of one or more of the stacked second semiconductor chips.

According to another embodiment, there is provided a semiconductor package having a plurality of memory chips and a memory controller disposed over a substrate. The semiconductor package includes a plurality of stacked first memory chips disposed over the substrate. At least a portion of the plurality of stacked first memory chips is encapsulated in a first mold layer. The semiconductor package also includes a plurality of stacked second memory chips disposed over the topmost chip of the stacked first semiconductor chips and the first mold layer. The semiconductor package also includes the memory controller disposed over the first mold layer and adjacent to the stacked second memory chips. At least a portion of the memory controller overlaps with a portion of one or more of the stacked second memory chips so as to reduce the size of the semiconductor package in proportion to the overlapping portion between the memory controller and the stacked second memory chips.

DETAILED DESCRIPTION OF THE EMBODIMENTS

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence. Further, the term "over" is used more inclusively herein to include the definition of "on" as well as the definition of "over." Thus, for example, an object "over" another object covers both situations where an object can be "on" or "over" another object.

A semiconductor package may include electronic devices such as semiconductor chips. The semiconductor chips may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor chips may be referred to as semiconductor dies according to their shape after the die sawing process.

The semiconductor package may include a printed circuit board (PCB) on which the semiconductor chip is mounted. The PCB may include at least one layer of integrated circuit patterns and may be referred as a package substrate in the present specification. A connection technique such as a wire bonding technique may be used for communication between the package substrate and the semiconductor chip.

The semiconductor package may be employed in various communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1A:
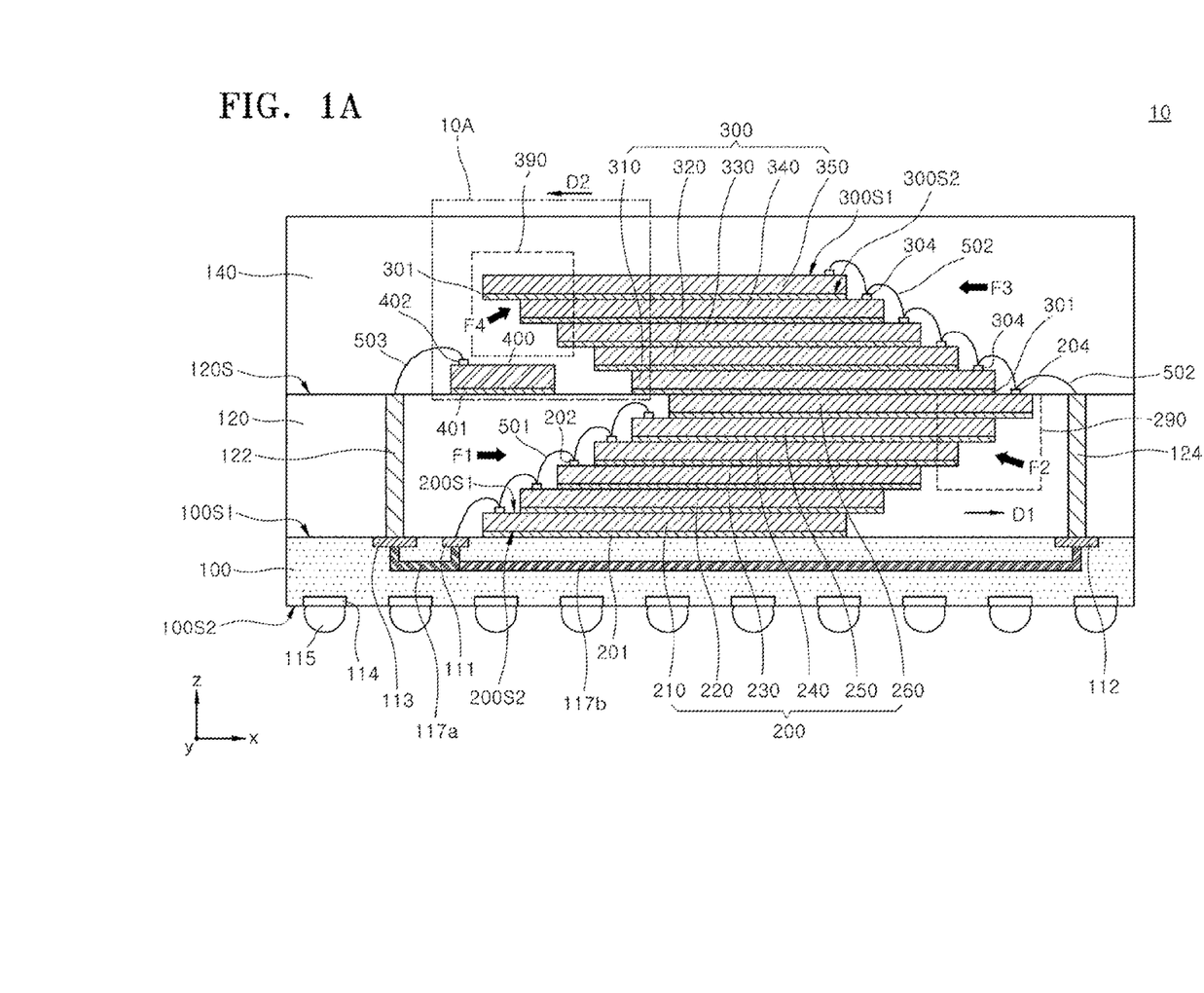
FIG. 1A is a cross-sectional view illustrating a semiconductor package according to an embodiment of the present disclosure.
Figure 1B:
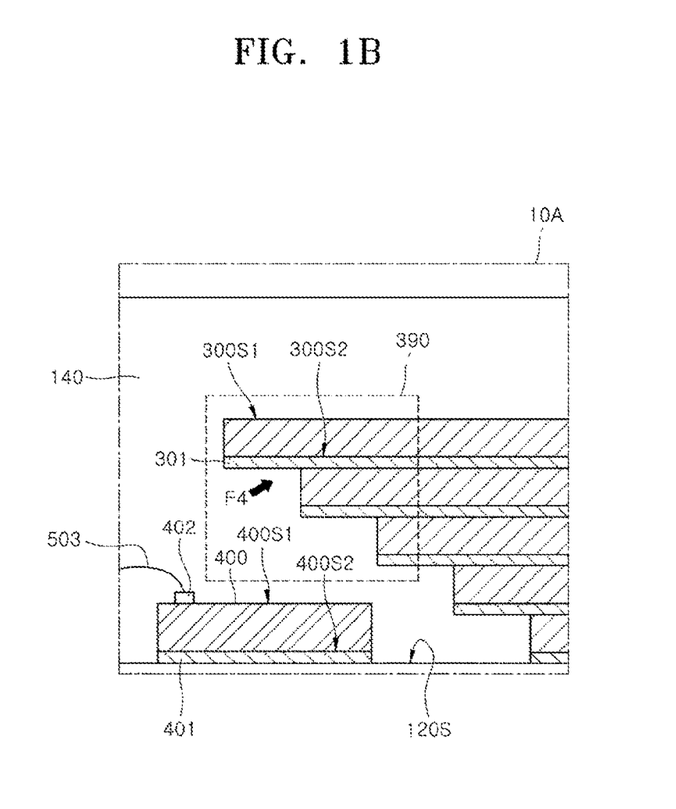
FIG. 1B is an enlarged view illustrating a portion '10A' of FIG. 1A.

FIG. 1A is a cross-sectional view illustrating a semiconductor package 10 according to an embodiment of the present disclosure. FIG. 1B is an enlarged view illustrating a portion '10A' of FIG. 1A. Referring to FIGS. 1A and 1B, the semiconductor package 10 may include a package substrate 100, a first chip stack 200 disposed on the package substrate 100, a first mold layer 120 disposed on the package substrate 100 to cover the first chip stack 200, a second chip stack 300 and a third semiconductor chip 400 disposed on the first mold layer 120, and a second mold layer 140 disposed on the first mold layer 120 to cover the second chip stack 300 and the third semiconductor chip 400. The third semiconductor chip 400 may be disposed on the first mold layer 120 such that at least a portion of the third semiconductor chip 400 vertically overlaps with an edge portion 390 of the second chip stack 300 protruding in a second direction D2.

In addition, the semiconductor package 10 may include first through mold vias 122 and second through mold vias 124 disposed in the first mold layer 120. The first through mold vias 122 may electrically connect the third semiconductor chip 400 to the package substrate 100, and the second through mold vias 124 may electrically connect the second chip stack 300 to the package substrate 100.

The package substrate 100 may correspond to an interconnection structure for electrically and signally connecting first and second semiconductor chips 210, 220, 230, 240, 250, 260, 310, 320, 330, 340 and 350 included in the first and second chip stacks 200 and 300 to an external device (not shown in FIG. 1A). The package substrate 100 may include multiple layers of circuit patterns and an insulation layer for electrically insulating the multiple layers of circuit patterns from each other. The package substrate 100 may be, for example, a printed circuit board (PCB), an interposer, or a flexible PCB.

The package substrate 100 includes a first surface 100S1 and a second surface 100S2. The first chip stack 200 is disposed on the first surface 100S1, and the second surface 100S2 is located opposite to the first chip stack 200. The package substrate 100 may include a substrate body comprised of an insulation material or a dielectric material and conductive trace patterns disposed on the first and second surfaces 100S1 and 100S2.

In an embodiment of the present disclosure, the conductive trace patterns may include first, second, and third chip connection patterns 111, 112, and 113 disposed to be adjacent to the first surface 100S1. As shown in FIG. 1A, the first, second, and third chip connection patterns 111, 112, and 113 may be embedded in the package substrate 100, and the top surfaces of the first, second, and third chip connection patterns 111, 112, and 113 may be exposed at the first surface 100S1. The first chip connection patterns 111 may be connected to first bonding wires 501 that electrically connect the first semiconductor chips 210, 220, 230, 240, and 250 of the first chip stack 200 to each other. The second chip connection patterns 112 may be connected to the second through mold vias 124. The second through mold vias 124 may be connected to second bonding wires 502 that electrically connect the second semiconductor chips 310, 320, 330, 340, and 350 of the second chip stack 300 to each other. The third chip connection patterns 113 may be connected to the first through mold vias 122. The first through mold vias 122 may be connected to third bonding wires 503 that are coupled to the third semiconductor chip 400. In addition, the first and second chip connection patterns 111 and 112 may be electrically connected to the third chip connection patterns 113 through first and second internal conductive trace patterns 117a and 117b. The second internal conductive trace patterns 117b may be electrically connected to the third chip connection patterns 113 through the first internal conductive trace patterns 117a, as illustrated in FIG. 1. Alternatively, the second internal conductive trace patterns 117b may be directly connected to the third chip connection patterns 113 according to an embodiment of the present disclosure.

In an embodiment, the conductive trace patterns may include ball connection patterns 114 disposed on the second surface 100S2. Outer connectors 115 may be attached to the ball connection patterns 114 to electrically connect the semiconductor package 10 to an external device. The outer connectors 115 may be, for example, solder balls, bumps, or solder paste patterns.

In an embodiment, the conductive trace patterns may further include internal conductive trace patterns (not shown) that electrically connect the first to third chip connection patterns 111, 112 and 113 to the ball connection patterns 114.

Referring to FIG. 1A, the first semiconductor chips 210, 220, 230, 240, 250, and 260 of the first chip stack 200 may be sequentially stacked to be offset in a first direction D1. Specifically, the first semiconductor chips 220, 230, 240, 250, and 260 may be sequentially stacked on the first semiconductor chip 210 to be offset in the first direction D1 relative to the first semiconductor chip 210. That is, the first semiconductor chips 210, 220, 230, 240, 250, and 260 are stacked to resemble a stair structure to rise in the first direction D1. As a result, the stair structure of the first chip stack 200 is formed with sides F1 and F2 as shown in FIG. 1A. The side F1 of the stair structure of the first chip stack 200 is also be referred to as a "normal" stair structure F1, and the side F2 of the stair structure of the first chip stack 200 is also be referred to as a "reversed" stair structure F2. As a result, one or more of the first semiconductor chips 210, 220, 230, 240, 250, and 260, which are typically from the top of the first chip stack 200, may have an edge portion 290 as the first chip stack 200 rise and protrude into the first direction D1.

In an embodiment, the first semiconductor chips 210, 220, 230, 240, 250, and 260 may be chips having the same function. The first semiconductor chips 210, 220, 230, 240, 250, and 260 may have the same dimension, for example, the same size. The first semiconductor chips 210, 220, 230, 240, 250, and 260 may be memory chips. In some other embodiments, at least one of the first semiconductor chips 210, 220, 230, 240, 250, and 260 may have a different function from the other of the first semiconductor chips 210, 220, 230, 240, 250, and 260.

Each of the first semiconductor chips 210, 220, 230, 240, 250, and 260 may have first chip pads 202. The first chip pads 202 may be disposed on edge regions of first surfaces 200S1 of the first semiconductor chips 210, 220, 230, 240, 250, and 260 exposed by the "normal" stair structure F1. As illustrated in FIG. 1A, each of the first semiconductor chips 210, 220, 230, 240, 250, and 260 may have a second surface 200S2 which is located opposite to the first chip pads 202 thereof. The first semiconductor chip 260, which is the topmost chip among the first semiconductor chips 210, 220, 230, 240, 250, and 260, may have first chip pads 204, and the first chip pads 204 may be located at an opposite side of the first pads 202 of the first semiconductor chips 210, 220, 230, 240, and 250. That is, the first pads 202 are located on the exposed portions of the "normal" stair structure F1 as shown in FIG. 1A, but the first chip pads 204 are located on the exposed portion on the opposite side also as shown in FIG. 1A. This is because the second semiconductor chips 310, 320, 330, 340, and 350 of the second chip stack 300 are stacked on the first chip stack 200 to resemble a stair structure, staggered to rise in the second direction D2 opposite to the first direction D1. That is, the second semiconductor chips 310, 320, 330, 340, 350, and 360 are stacked to resemble a stair structure to rise in the second direction D2 as shown in FIG. 1A. The first chip pads 202 of the first semiconductor chips 210, 220, 230, 240, and 250 may be electrically connected to each other by the first bonding wires 501, and the first bonding wires 501 may extend to electrically connect the first chip stack 200 to the first chip connection patterns 111. Thus, the first chip connection patterns 111 may be disposed to be adjacent to the "normal" stair structure F1 of the first chip stack 200.

The first semiconductor chip 210, which is the bottommost chip among the first semiconductor chips 210, 220, 230, 240, 250, and 260, may be bonded to the package substrate 100 using an adhesive layer 201. In addition, the remaining first semiconductor chips 220, 230, 240, 250, and 260 may also be bonded to each other by the adhesive layer 201 located therebetween.

Referring again to FIG. 1A, the first mold layer 120 may be disposed on the first surface 100S1 of the package substrate 100 to cover the first chip stack 200. The first mold layer 120 may be formed to encapsulate and protect the first chip stack 200 from external environment. The first mold layer 120 may include an insulation material such as an epoxy molding compound (EMC) material. According to an embodiment as shown in FIG. 1A, the first mold layer 120 is formed to encapsulate the first chip stack 200 while exposing the topmost first semiconductor chip 260, so that the second chip stack 300 may be formed on the exposed surface of the topmost first semiconductor chip 260.

The first through mold vias 122 and the second through mold vias 124 may be disposed in the first mold layer 120. Each of the first and second through mold vias 122 and 124 may include a conductive material. For example, each of the first and second through mold vias 122 and 124 may be formed of a metal plating layer. In an embodiment, the first and second through mold vias 122 and 124 may be fabricated by patterning the first mold layer 120 to form through holes exposing the second and third chip connection patterns 112 and 113 and by filling the through holes with a conductive material using a plating process. The first through mold vias 122 may be disposed to be adjacent to the normal stair structure F1, and the second through mold vias 124 may be disposed to be adjacent to the reversed stair structure F2.

The second chip stack 300 may be disposed on a first surface 120S of the first mold layer 120. The second semiconductor chips 310, 320, 330, 340, and 350 of the second chip stack 300 may be sequentially stacked on the first chip stack 200 to be offset in the second direction D2 opposite to the first direction D1. Specifically, the second semiconductor chips 310, 320, 330, 340, and 350 may be sequentially stacked on the topmost first semiconductor chip 260 to be offset in the second direction D2. As a result, the stair structure of the second chip stack 300 is formed with sides F3 and F4 as shown in FIG. 1A. The side F3 of the stair structure of the second chip stack 300 is also be referred to as a "normal" stair structure F3, and the side F4 of the stair structure of the second chip stack 300 is also be referred to as a "reversed" stair structure F4. As a result, one or more of the second semiconductor chips 310, 320, 330, 340 and 350, which are typically from the top of the second chip stack 300, may have an edge portion 390 as the second chip stack 300 rise and protrude into the second direction D2. As a result, one or more of the first semiconductor chips 210, 220, 230, 240, 250, and 260, which are typically from the top of the first chip stack 200, may have an edge portion 290 as the first chip stack 200 rise and protrude into the first direction D1.

In an embodiment, the second semiconductor chips 310, 320, 330, 340, and 350 may be chips having the same function. The second semiconductor chips 310, 320, 330, 340, and 350 may have the same dimension, for example, the same size. The second semiconductor chips 310, 320, 330, 340, and 350 may be memory chips. In some other embodiments, at least one of the second semiconductor chips 310, 320, 330, 340, and 350 may have a different function from the others of the second semiconductor chips 310, 320, 330, 340, and 350. Alternatively, the second semiconductor chips 310, 320, 330, 340, and 350 may have the same function as the first semiconductor chips 210, 220, 230, 240, 250, and 260 according to an embodiment of the present disclosure. That is, the second semiconductor chips 310, 320, 330, 340, and 350 may have the same size as the first semiconductor chips 210, 220, 230, 240, 250, and 260.

Each of the second semiconductor chips 310, 320, 330, 340 and 350 may have second chip pads 304. The second chip pads 304 may be disposed on edge regions of first surfaces 300S1 of the second semiconductor chips 310, 320, 330, 340, and 350 exposed by the "normal" stair structure F3. As illustrated in FIG. 1A, each of the second semiconductor chips 310, 320, 330, 340, and 350 may have a second surface 300S2 which is located opposite to the second chip pads 304 thereof. The second chip pads 304 of the second semiconductor chips 310, 320, 330, 340, and 350 may be electrically connected to each other by the second bonding wires 502. In addition, the second chip pads 304 of the second semiconductor chips 310, 320, 330, 340, and 350 may be connected to the first chip pads 204 of the topmost first semiconductor chip 260 of the first chip stack 200 through the second bonding wires 502. The second bonding wires 502 may extend to be connected to the second through mold vias 124.

In an embodiment, the second bonding wires 502 may be directly connected to top surfaces of the second through mold vias 124. However, it should be readily understood that the scope of the present disclosure as described through various embodiments is not limited only to that shown in FIG. 1A. Although not shown in the drawings, conductive patterns for via connection may be disposed on respective ones of top surfaces of the second through mold vias 124, and the second bonding wires 502 may be bonded to respective ones of the conductive patterns for via connection. The conductive patterns for via connection may be formed using a general deposition process technique.

The second semiconductor chip 310 corresponding to a bottommost chip among the second semiconductor chips 310, 320, 330, 340, and 350 may be bonded to the first semiconductor chip 260 using an adhesive layer 301. In addition, the remaining second semiconductor chips 320, 330, 340, and 350 may also be bonded to each other by the adhesive layer 301 located therebetween.

Referring to FIGS. 1A and 1B, the third semiconductor chip 400 may be disposed on the first mold layer 120 to be laterally adjacent to the second chip stack 300. The third semiconductor chip 400 may be disposed to face the "reversed" stair structure F4 of the second chip stack 300. The third semiconductor chip 400 may include third chip pads 402. The third chip pads 402 may be disposed on an edge region of a first surface 400S1 of the third semiconductor chip 400. As illustrated in FIG. 1A, the third semiconductor chip 400 may have the first surface 400S1 on which the third chip pads 402 are disposed and a second surface 400S2 which is located opposite to the third chip pads 402. The third semiconductor chip 400 may be attached to the first mold layer 120 using an adhesive layer 401.

The third chip pads 402 may be connected to the first through mold vias 122 by the third bonding wires 503. In an embodiment, the third bonding wires 503 may be directly bonded to top surfaces of the first through mold vias 122. However, it should be readily understood that the scope of the present disclosure as described through various embodiments is not limited only to that shown in FIG. 1A. That is, although not shown in the drawings, conductive patterns for via connection may be disposed on respective ones of top surfaces of the first through mold vias 122, and the third bonding wires 503 may be bonded to respective ones of the conductive patterns for via connection. The conductive patterns for via connection may be formed using a general deposition process technique. The third semiconductor chip 400 may be electrically connected to the third chip connection patterns 113 through the third bonding wires 503 and the first through mold vias 122. In addition, because the third chip connection patterns 113 are connected to the first and second chip connection patterns 111 and 112 through the first and second internal conductive trace patterns 117a and 117b, the third semiconductor chip 400 may be electrically connected to the first and second semiconductor chips 210, 220, 230, 240, 250, 260, 310, 320, 330, 340, and 350 of the first and second chip stacks 200 and 300. The second internal conductive trace patterns 117b may be electrically connected to the third chip connection patterns 113 through the first internal conductive trace patterns 117a, as illustrated in FIG. 1A. However, alternatively, the second internal conductive trace patterns 117b may be directly connected to the third chip connection patterns 113 according to an embodiment of the present disclosure.

In an embodiment, the first and second semiconductor chips 210, 220, 230, 240, 250, 260, 310, 320, 330, 340, and 350 of the first and second chip stacks 200 and 300 may be memory chips, and the third semiconductor chip 400 may be a logic chip including logic circuits. For example, the third semiconductor chip 400 may be a controller chip that controls operations of the first and second semiconductor chips 210, 220, 230, 240, 250, 260, 310, 320, 330, 340, and 350.

Referring again to FIGS. 1A and 1B, at least a portion of the third semiconductor chip 400 may vertically overlap with the edge portion 390 of the second chip stack 300 protruding in the second direction D2. That is, at least a portion of the third semiconductor chip 400 may be located below the "reversed" stair structure F4 of the second chip stack 300. In other words, one or more of the stacked second semiconductor chips 310, 320, 330, 340, and 350, rising in the second direction, rise over at least a portion of the third semiconductor chip 400. As such, since at least a portion of the third semiconductor chip 400 overlaps with the edge portion 390 of the second chip stack 300 in a plan view, it may be possible to increase a spatial margin which is capable of disposing the third semiconductor chip 400. In addition, the third semiconductor chip 400 may be disposed on the first mold layer 120 to be adjacent to the second chip stack 300, thereby increasing the integration density of the semiconductor package 10.

Although FIGS. 1A and 1B illustrate an example in which a portion of the third semiconductor chip 400 vertically overlaps with the edge portion 390 of the second chip stack 300, the present disclosure may not be limited thereto. For example, in some other embodiments, the third semiconductor chip 400 may be disposed such that an entire portion of the third semiconductor chip 400 vertically overlaps with the edge portion 390 of the second chip stack 300 protruding in the second direction D2.

The second mold layer 140 may be disposed on the first surface 120S of the first mold layer 120 to cover the second chip stack 300 and the third semiconductor chip 400. The second mold layer 140 may be disposed to protect the second chip stack 300 and the third semiconductor chip 400 from an external environment. The second mold layer 140 may include an insulation material such as an EMC material.

Figure 2:
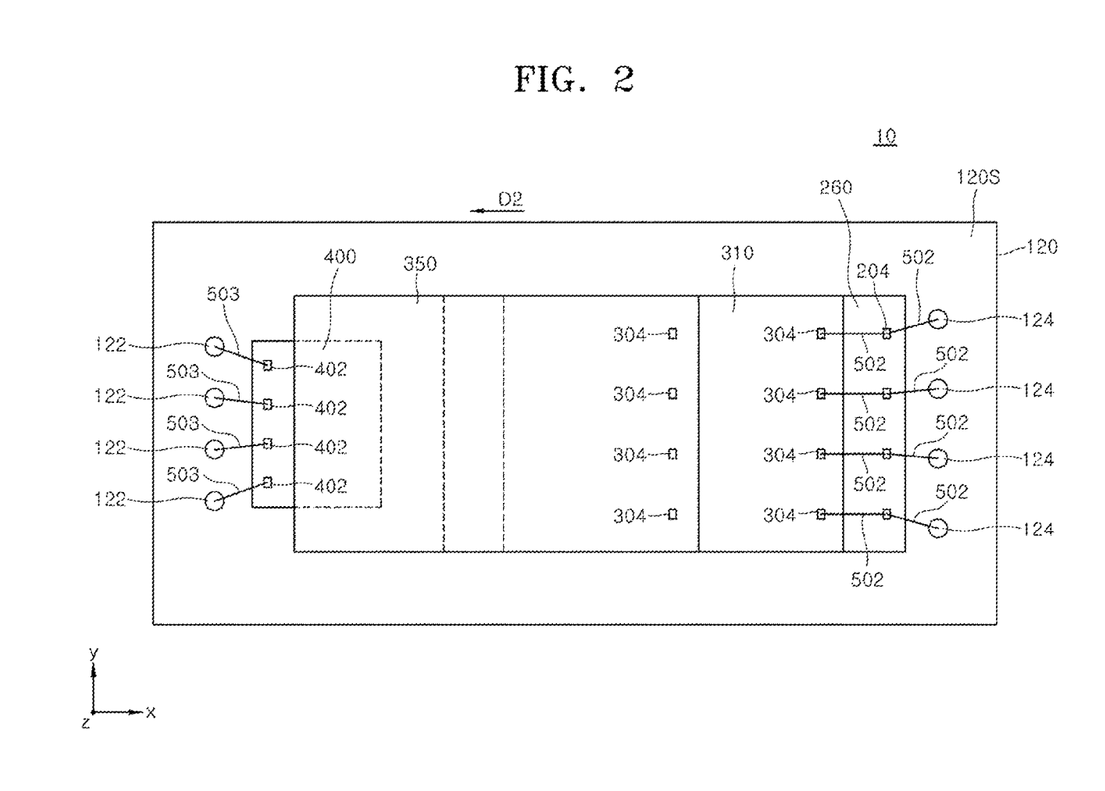
FIG. 2 is a plan view illustrating a portion of a semiconductor package according to an embodiment of the present disclosure.

FIG. 2 is a plan view illustrating a portion of the semiconductor package 10 illustrated in FIGS. 1A and 1B. More specifically, FIG. 2 illustrates selectively the portions relating to the bottommost and the topmost second semiconductor chips 310 and 350 of the second chip stack 300 disposed on the first mold layer 120. Also the third semiconductor chip 400 is disposed on the first mold layer 120 adjacent to the second chip stack 300, among other various elements of the semiconductor package 10, which are illustrated in FIGS. 1A and 1B but may not be illustrated specifically in FIG. 2. Moreover, a portion of the topmost first semiconductor chip 260 of the first chip stack 200 is exposed at the first surface 120S of the first mold layer 120 as illustrated in FIG. 2. The second semiconductor chips 320, 330, and 340 of the second chip stack 300 (that is, stacked between the topmost second chip 350 and the bottommost second chip 310) and the bonding wires directly connected to the second semiconductor chips 320, 330, and 340 are omitted specifically in FIG. 2 as their presence can be readily understood albeit not shown in FIG. 2.

Referring to FIG. 2, the second chip pads 304 on the bottommost second semiconductor chip 310 of the second chip stack 300 may be electrically connected to the first chip pads 204 on the topmost first semiconductor chip 260 of the first chip stack 200 through the second bonding wires 502. Furthermore, the second bonding wires 502 may electrically connect the first chip pads 204 located on the topmost first semiconductor chip 260 to the second through mold vias 124.

The third chip pads 402 on the third semiconductor chip 400 may be electrically connected to the first through mold vias 122 by the third bonding wires 503.

As illustrated in FIG. 2, as seen vertically, which is labeled as the z-axis direction in FIG. 2, at least a portion of the third semiconductor chip 400 may overlap with the topmost second semiconductor chip 350 of the second chip stack 300, which is offset relative to the bottommost second semiconductor chip 310 in the second direction D2. In an embodiment, a planar area of the third semiconductor chip 400 may be less than a planar area of the second semiconductor chip 310 or 350. Due to the overlapping design that allows the third semiconductor chip to be disposed under a portion of the stair-like structure of the second chip stack 300, the overall package size of the semiconductor package 10 can be reduced for greater compactness.

As described with reference to FIGS. 1A-1B and 2, the semiconductor package 10 according to an embodiment may include the package substrate 100, the first chip stack 200 stacked on the package substrate 100, the first mold layer 120 covering the first chip stack 200, the second chip stack 300 and the third semiconductor chip 400 stacked on the first mold layer 120, and the second mold layer 140 disposed on the first mold layer 120 to cover the second chip stack 300 and the third semiconductor chip 400. In such a case, the third semiconductor chip 400 may be disposed on the first surface 120S of the first mold layer 120. The density of circuit patterns on the first surface 120S of the first mold layer 120 may be zero or may be less than a density of circuit patterns on the first surface 100S1 of the package substrate 100. This may lead to increased spatial margin, which is capable of disposing the third semiconductor chip 400.

In addition, because the second chip stack 300 is formed by sequentially stacking the second semiconductor chips 310, 320, 330, 340, and 350 to be offset in a certain direction to resemble a stair-like structure, the third semiconductor chip 400 may be disposed to vertically overlap with an edge portion of the second chip stack 300 protruding in the rising direction of the stair-like structure. Accordingly, the third semiconductor chip 400 may be disposed on the first surface 120S of the first mold layer 120 to be close to the second chip stack 300. Thus, the overall size of the semiconductor package 10 may be reduced, and the integration density of the semiconductor package 10 may increase.

According to an embodiment described above, the third semiconductor chip 400 may be electrically connected to the third chip connection patterns 113 of the package substrate 100 by the first through mold vias 122 disposed in the first mold layer 120. In addition, the third semiconductor chip 400 may be electrically connected to the first and second chip connection patterns 111 and 112 through the first and second internal conductive trace patterns 117a and 117b disposed in the package substrate 100. Moreover, the third semiconductor chip 400 may be electrically connected to the first and second chip stacks 200 and 300 through the first and second bonding wires 501 and 502. In an embodiment, if the first and second semiconductor chips 210, 220, 230, 240, 250, 260, 310, 320, 330, 340, and 350 are memory chips and the third semiconductor chip 400 is a controller chip, the third semiconductor chip 400 disposed on the first mold layer 120 may effectively control operations of the first and second semiconductor chips 210, 220, 230, 240, 250, 260, 310, 320, 330, 340, and 350 of the first and second chip stacks 200 and 300 through the various interconnection patterns described above.

Figure 3A:
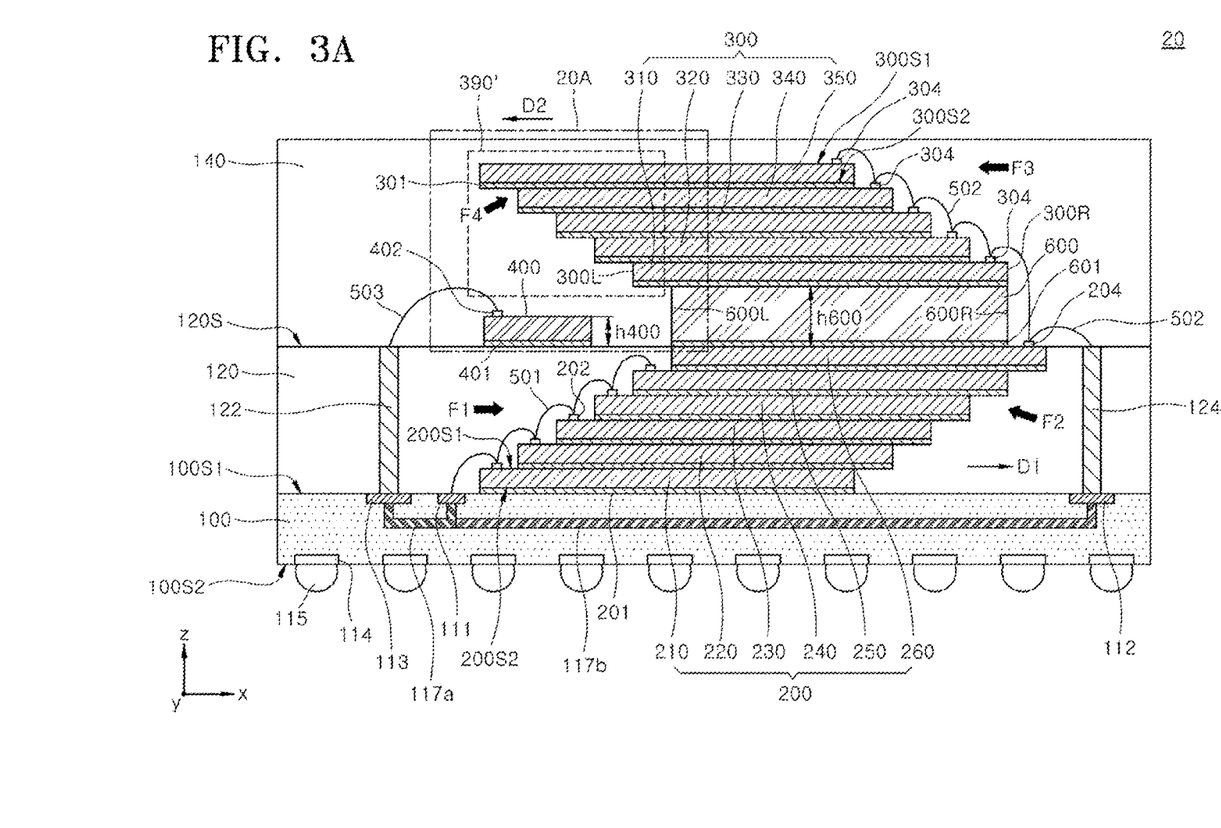
FIG. 3A is a cross-sectional view illustrating a semiconductor package according to another embodiment of the present disclosure.
Figure 3B:
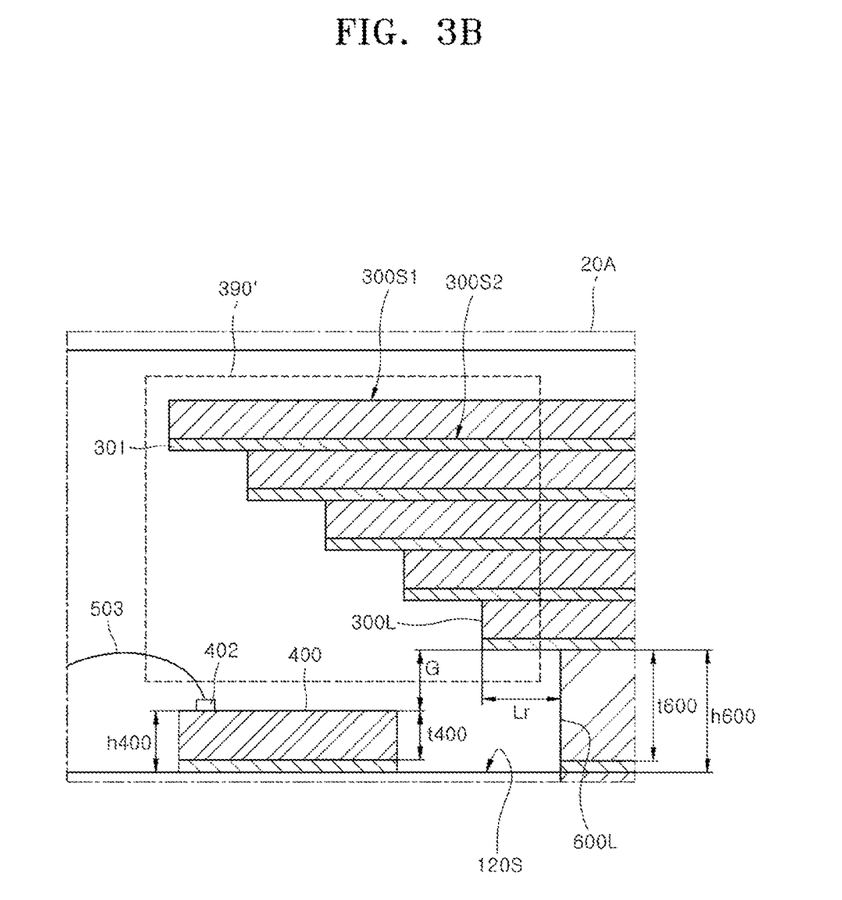
FIG. 3B is an enlarged view illustrating a portion '20A' of FIG. 3A.
Figure 4:
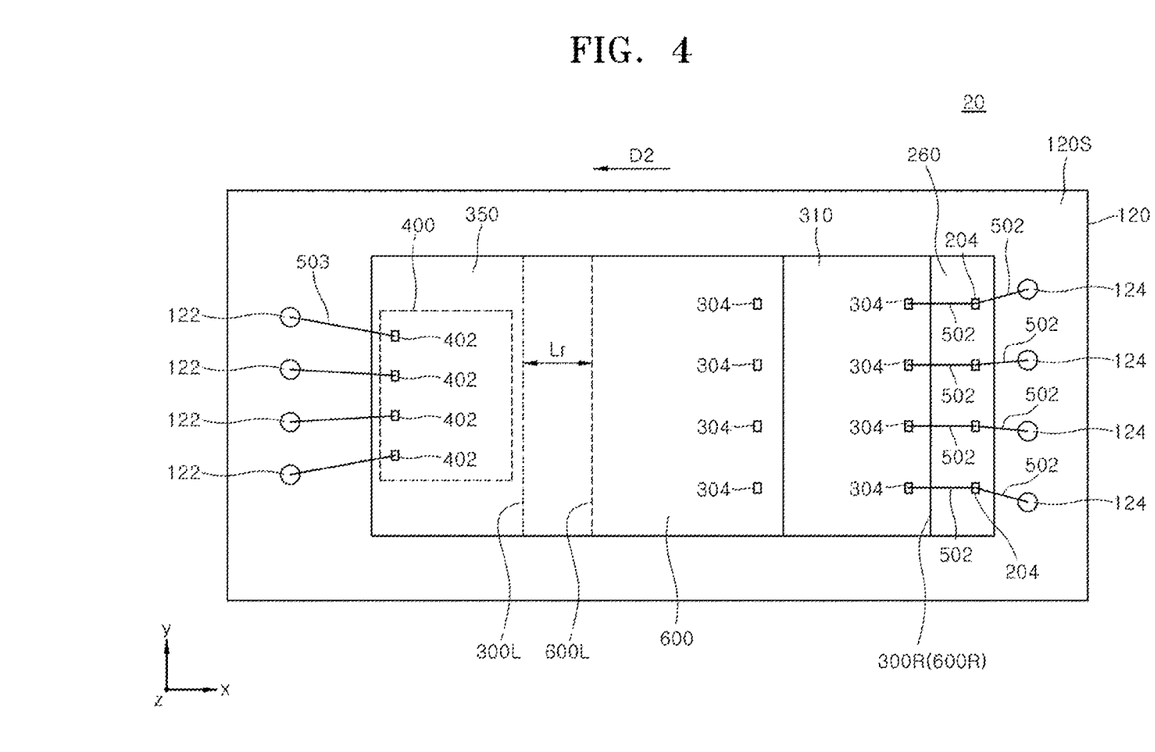
FIG. 4 is a plan view illustrating a portion of a semiconductor package according to another embodiment of the present disclosure.

FIG. 3A is a cross-sectional view illustrating a semiconductor package 20 according an embodiment of the present disclosure. FIG. 3B is an enlarged view illustrating a portion '20A' of the semiconductor package 20 illustrated FIG. 3A. FIG. 4 is a plan view illustrating a portion of the semiconductor package 20. FIG. 4 illustrates selectively the bottommost and topmost second semiconductor chips 310 and 350 of the second chip stack 300 disposed on the first mold layer 120 as well as the third semiconductor chip 400 disposed to be adjacent to the second chip stack 300, among the various elements of the semiconductor package 20 illustrated in FIGS. 3A and 3B. Moreover, the first semiconductor chip 260, which is exposed at the first surface 120S of the first mold layer 120 to correspond to the topmost chip 210 of the first chip stack 200, is illustrated in FIG. 4. The second semiconductor chips 320, 330, and 340 (in which are stacked between the topmost second chip 350 and the bottommost second chip 310) of the second chip stack 300 and the bonding wires directly connected to the second semiconductor chips 320, 330, and 340 are not specifically shown in FIG. 4 but their presence should be readily understood according to an embodiment of the present disclosure.

Referring to FIGS. 3A-3B and 4, the semiconductor package 20 may further include a supporting structure 600 disposed between the first mold layer 120 and the second chip stack 300, as compared to the semiconductor package 10 described with reference to FIGS. 1A-1B and 2.

The supporting structure 600 may be disposed on the first surface 120S of the first mold layer 120. The supporting structure 600 may be attached to the first mold layer 120 by an adhesive layer 601. In an embodiment, the supporting structure 600 may be a dummy pattern comprised of an insulation material. Alternatively, the supporting structure 600 may be a PCB including integrated circuits therein or an interposer according to an embodiment of the disclosure. In such a case, the supporting structure 600 may be disposed between the topmost first semiconductor chip 260 of the first chip stack 200 and the bottommost second semiconductor chip 310 of the second chip stack 300 to separate the two chips 260 and 310 from each other.

Referring to FIG. 3B, the thickness t600 of the supporting structure 600 may be greater than the thickness t400 of the third semiconductor chip 400. The height h600 from the first surface 120S of the first mold layer 120 to the top surface of the supporting structure 600 may be greater than a height h400 from the first surface 120S of the first mold layer 120 to a top surface of the third semiconductor chip 400. Thus, there may be a gap G corresponding to a level difference between the top surfaces of the third semiconductor chip 400 and the supporting structure 600 (that is, the difference between h600 and h400 as shown in FIG. 3B).

Referring again to FIGS. 3A-3B and 4, shown therein are a first side surface 600L and a second side surface 600R of the supporting structure 600 on the opposite sides thereof. The bottommost second semiconductor chip 310 of the second chip stack 300 may have a first side surface 300L and a second side surface 300R that face each other. In such a case, the first side surface 600L of the supporting structure 600 may be offset in the first direction D1 relative to the first side surface 300L of the second semiconductor chip 310. Specifically, the first side surface 600L of the supporting structure 600 may be disposed to be offset relative to the first side surface 300L of the second semiconductor chip 310 by a distance Lr toward a central portion of the second semiconductor chip 310.

Referring to FIG. 4, a planar area of the supporting structure 600 may be less than a planar area of the second semiconductor chip 310 of the second chip stack 300. Thus, an additional space capable of accommodating at least a portion of the third semiconductor chip 400 may be provided below the second semiconductor chip 310. As a result, an edge portion 390' (as shown in FIG. 3B) of the second chip stack 300 protruding in the second direction D2 may be disposed to fully overlap with an entire portion of the third semiconductor chip 400. That is, the third semiconductor chip 400 may be disposed to fully overlap with the edge portion 390' of the second chip stack 300 when viewed from a plan view.

According to an embodiment of the present disclosure as described above, the supporting structure 600 may be disposed between the first mold layer 120 and the second chip stack 300. A height of the supporting structure 600 may be set to be greater than the height of the third semiconductor chip 400, and the first side surface 600L of the supporting structure 600 may be located to be offset in the first direction D1 relative to the first side surface 300L of the second semiconductor chip 310. As a result, a spatial margin which is capable of disposing the third semiconductor chip 400 on the first mold layer 120 may increase to reduce a size of the semiconductor package 20.

Figure 5:
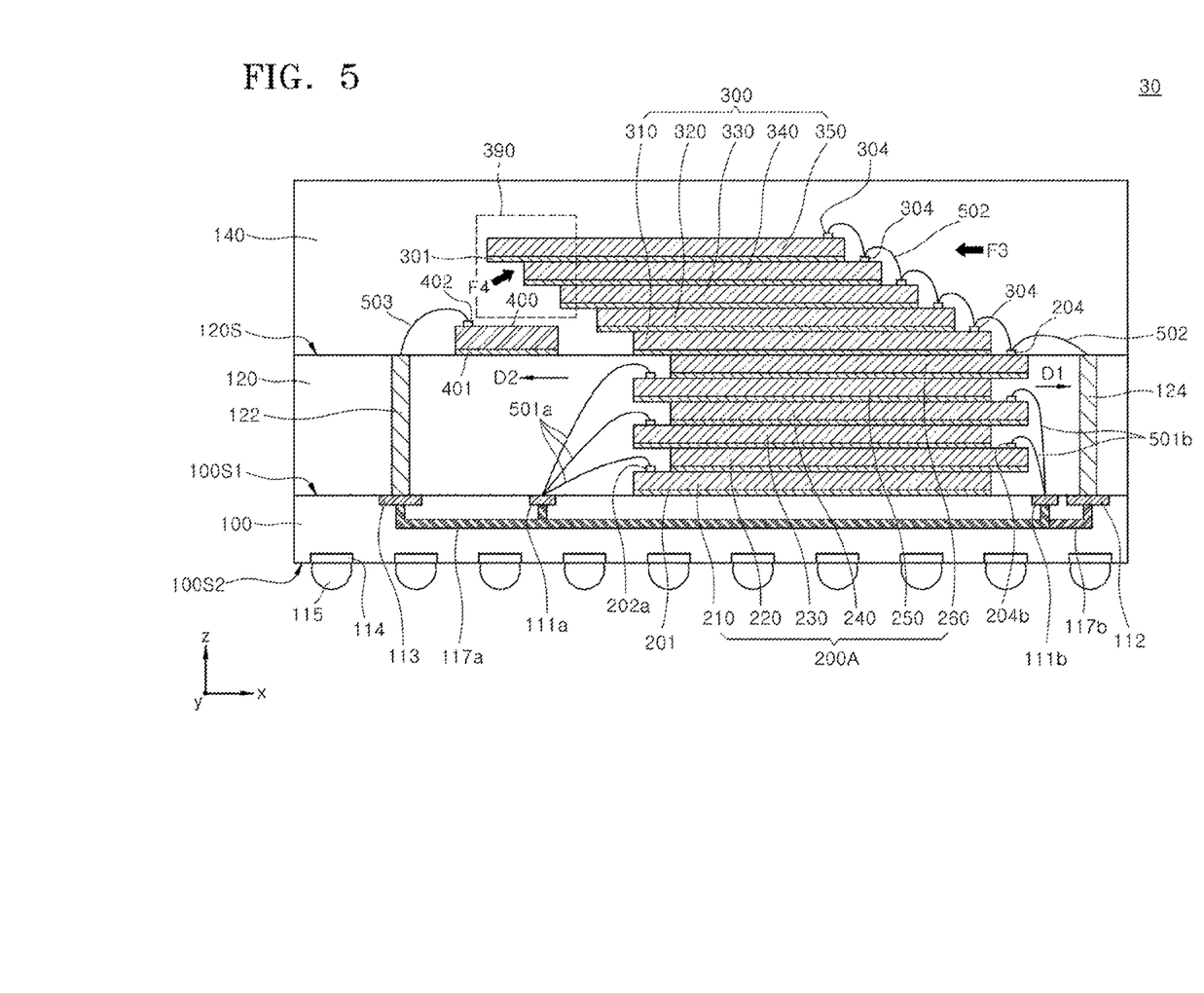
FIG. 5 is a cross-sectional view illustrating a semiconductor package according to yet another embodiment of the present disclosure.

FIG. 5 is a cross-sectional view illustrating a semiconductor package 30 according to an embodiment of the present disclosure. Referring to FIG. 5, the semiconductor package 30 may include a first chip stack 200A having a stack configuration which is different from a stack configuration of the first chip stack 200 as compared with the semiconductor package 10 described with reference to FIGS. 1A-1B and 2.

Referring to FIG. 5, the first semiconductor chips 210, 220, 230, 240, 250, and 260 of the first chip stack 200A may be sequentially stacked on the package substrate 100 to be alternately offset in the first and second directions D1 and D2. For example, the first semiconductor chips 210, 220, 230, 240, 250, and 260 of the first chip stack 200A may be sequentially stacked in a zigzag fashion along a vertical direction.

The first semiconductor chips 210, 230, and 250 stacked to be offset in the second direction D2 relative to the first semiconductor chips 220 and 240 may be electrically connected to first chip connection patterns 111a of the package substrate 100 through first chip pads 202a disposed on first edge portions of the first semiconductor chips 210, 230, and 250 protruding in the second direction D2. The first semiconductor chips 210, 230, and 250 may be electrically connected to the first chip connection patterns 111a through first bonding wires 501a. In addition, the first semiconductor chips 220 and 240 stacked to be offset in the first direction D1 relative to the first semiconductor chips 210, 230, and 250 may be electrically connected to first chip connection patterns 111b of the package substrate 100 through first chip pads 204b disposed on first edge portions of the first semiconductor chips 220 and 240 protruding in the first direction D1. The first semiconductor chips 220 and 240 may be electrically connected to the first chip connection patterns 111b through first bonding wires 501b. The third chip connection patterns 113 may be electrically connected to the first and second chip connection patterns 111a, 111b, and 112 through the first and second internal conductive trace patterns 117a and 117b disposed in the package substrate 100. Thus, the third semiconductor chip 400 may be electrically connected to the first and second semiconductor chips 210, 220, 230, 240, 250, 260, 310, 320, 330, 340, and 350 of the first and second chip stacks 200 and 300. As illustrated in FIG. 5, the second internal conductive trace patterns 117b may be electrically connected to the third chip connection patterns 113 through the first internal conductive trace patterns 117a. Alternatively, the second internal conductive trace patterns 117b may be directly connected to the third chip connection patterns 113 according to an embodiment of the present disclosure.

According to the various embodiments described above, each of chip stacks in a semiconductor package may configured to include a plurality of semiconductor chips stacked to be offset and a mold layer covering the plurality of semiconductor chips. Thus, another semiconductor chip electrically connected to the chip stacks may be efficiently disposed in the semiconductor package. Accordingly, a size of the semiconductor package may be reduced, and an integration density of the semiconductor package may increase.

Figure 6:
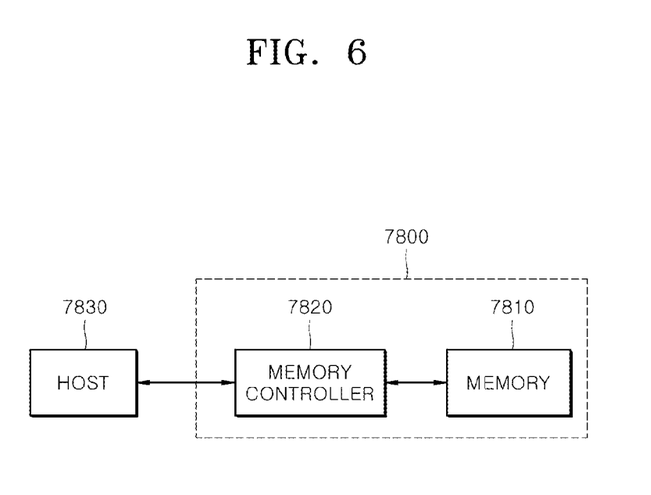
FIG. 6 is a block diagram illustrating an electronic system employing a memory card including at least one of the semiconductor packages according to the embodiments.

FIG. 6 is a block diagram illustrating an electronic system including a memory card 7800 employing the semiconductor package according to an embodiment of the present disclosure. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 7:
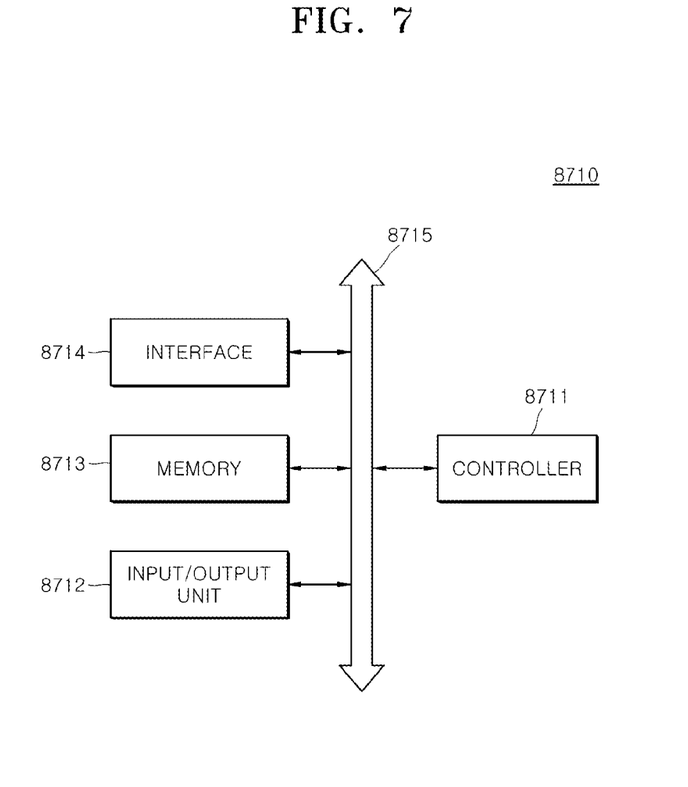
FIG. 7 is a block diagram illustrating another electronic system including at least one of the semiconductor packages according to the embodiments.

FIG. 7 is a block diagram illustrating an electronic system 8710 including at least one of the semiconductor packages according to an embodiment of the present disclosure. The electronic system 8710 may include a controller 8711, an input/output unit 8712 and a memory 8713. The controller 8711, the input/output unit 8712, and the memory 8713 may be coupled with one another through a bus 8715 providing a path through which data can move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to an embodiment of the present disclosure as described herein. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Various embodiments of the present disclosure have been disclosed herein for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a plurality of stacked first semiconductor chips disposed over a substrate, at least a portion of which is encapsulated in a first mold layer;
a plurality of stacked second semiconductor chips disposed over the topmost chip of the plurality of stacked first semiconductor chips and the first mold layer; and
a third semiconductor chip also disposed over the first mold layer and adjacent to the plurality of stacked second semiconductor chips,
wherein at least a portion of the third semiconductor chip overlaps with a portion of one or more of the stacked second semiconductor chips.

2. The semiconductor package of claim 1,
wherein the plurality of stacked second semiconductor chips are stacked to resemble a stair structure staggered to rise in a second direction,
such that one or more of the plurality of stacked second semiconductor chips rising in the second direction rise over at least a portion of the third semiconductor chip.

3. The semiconductor package of claim 2,
wherein the plurality of stacked first semiconductor chips are stacked to resemble a stair structure staggered to rise in a first direction opposite of the second direction.

4. The semiconductor package of claim 3,
wherein the bottommost chip of the plurality of stacked second semiconductor chips is disposed on the topmost chip of the plurality of stacked first semiconductor chips at an offset so as to expose an end portion of the topmost chip of the plurality of stacked first semiconductor chips.

5. The semiconductor package of claim 3, further comprising:
first through mold vias formed in the first mold layer adjacent to a first side of the stair structure of the plurality of stacked first semiconductor chips, and
second through mold vias formed in the first mold layer adjacent to a second side of the stair structure of the plurality of stacked first semiconductor chips,
wherein the second side is opposite to the first side of the stair structure of the plurality of stacked first semiconductor chips.

6. The semiconductor package of claim 5, further comprising:
first bonding wires electrically connecting the plurality of stacked first semiconductor chips to chip connection patterns of the package substrate;
second bonding wires electrically connecting the plurality of stacked second semiconductor chips and the topmost chip of the plurality of stacked first semiconductor chips to the second through mold vias; and
third bonding wires electrically connecting the third semiconductor chip to the first through mold vias.

7. The semiconductor package of claim 6, wherein the package substrate comprises:
first chip connection patterns disposed to be adjacent to the first side of the stair structure of the plurality of stacked first semiconductor chips, and connected to the first bonding wires;
second chip connection patterns disposed to be adjacent to the second side of the stair structure of the plurality of stacked first semiconductor chips, and connected to the second through mold vias; and
third chip connection patterns disposed to be adjacent to the first side of the stair structure of the plurality of stacked first semiconductor chips, and connected to the first through mold vias.

8. The semiconductor package of claim 7, wherein the first and second chip connection patterns are electrically connected to the third chip connection patterns by internal conductive trace patterns disposed in the package substrate.

9. The semiconductor package of claim 2,
wherein the plurality of stacked first semiconductor chips are stacked to resemble a zigzag structure rising vertically so as to expose the end portions of the plurality of stacked first semiconductor chips, and
wherein the bottommost chip of the plurality of stacked second semiconductor chips is disposed on the topmost chip of the plurality of stacked first semiconductor chips at an offset so as to expose an end portion of the topmost chip of the plurality of stacked first semiconductor chips.

10. The semiconductor package of claim 1, further comprising
a supporting structure formed between the first mold layer and the bottom-most chip of the plurality of stacked second semiconductor chips.

11. The semiconductor package of claim 10,
wherein the plurality of stacked second semiconductor chips are stacked over at least a portion of the supporting structure and to resemble a stair structure staggered to rise in a second direction,
such that one or more of the plurality of stacked second semiconductor chips rising in the second direction rise over at least a portion of the third semiconductor chip.

12. The semiconductor package of claim 11,
wherein the thickness of the supporting structure is greater than the thickness of the third semiconductor chip.

13. The semiconductor package of claim 10,
wherein the plurality of first semiconductor chips are stacked to resemble a stair structure staggered to rise in a first direction opposite of the second direction.

14. The semiconductor package of claim 13,
wherein the bottommost chip of the plurality of stacked second semiconductor chips is disposed on the topmost chip of the plurality of stacked first semiconductor chips at an offset so as to expose an end portion of the topmost chip of the plurality of stacked first semiconductor chips.

15. The semiconductor package of claim 13, further comprising:
   first through mold vias formed in the first mold layer adjacent to a first side of the stair structure of the plurality of stacked first semiconductor chips, and
   second through mold vias formed in the first mold layer adjacent to a second side of the stair structure of the plurality of stacked first semiconductor chips,
   wherein the second side is opposite to the first side of the stair structure of the plurality of stacked first semiconductor chips.

16. The semiconductor package of claim 15, further comprising:
   first bonding wires electrically connecting the plurality of stacked first semiconductor chips to chip connection patterns of the package substrate;
   second bonding wires electrically connecting the plurality of stacked second semiconductor chips and a topmost chip of the plurality of stacked first semiconductor chips to the second through mold vias; and
   third bonding wires electrically connecting the third semiconductor chip to the first through mold vias.

17. The semiconductor package of claim 16, wherein the package substrate comprises:
   first chip connection patterns disposed to be adjacent to the first side of the stair structure of the plurality of stacked first semiconductor chips, and connected to the first bonding wires;
   second chip connection patterns disposed to be adjacent to the second side of the stair structure of the plurality of stacked first semiconductor chips, and connected to the second through mold vias; and
   third chip connection patterns disposed to be adjacent to the first side of the stair structure of the plurality of stacked first semiconductor chips, and connected to the first through mold vias.

18. The semiconductor package of claim 17, wherein the first and second chip connection patterns are electrically connected to the third chip connection patterns by internal conductive trace patterns disposed in the package substrate.

19. The semiconductor package of claim 10,
   wherein the plurality of stacked first semiconductor chips are stacked to resemble a zigzag structure rising vertically so as to expose the end portions of the plurality of stacked first semiconductor chips, and
   wherein the bottommost chip of the plurality of stacked second semiconductor chips is disposed on the topmost chip of the plurality of stacked first semiconductor chips at an offset so as to expose an end portion of the topmost chip of the plurality of stacked first semiconductor chips.

20. A semiconductor package having a plurality of memory chips and a memory controller disposed over a substrate, the semiconductor package comprising:
   a plurality of stacked first memory chips disposed over the substrate, at least a portion of which is encapsulated in a first mold layer;
   a plurality of stacked second memory chips disposed over the topmost chip of the plurality of stacked first memory chips and the first mold layer; and
   the memory controller also disposed over the first mold layer and adjacent to the plurality of stacked second memory chips,
   wherein at least a portion of the memory controller overlaps with a portion of one or more of the plurality of stacked second memory chips so as to reduce the size of the semiconductor package in proportion to the overlapping portion between the memory controller and the plurality of stacked second memory chips.

21. The semiconductor package of claim 20, further comprising
   a supporting structure formed between the first mold layer and the bottom-most chip of the plurality of stacked second memory chips.

22. The semiconductor package of claim 20, further comprising:
   first through mold vias formed in the first mold layer adjacent to a first side of a stair structure of the plurality of stacked first memory chips, and
   second through mold vias formed in the first mold layer adjacent to a second side of a stair structure of the plurality of stacked first memory chips,
   wherein the second side is opposite to the first side of the stair structure of the plurality of stacked first semiconductor chips.

23. The semiconductor package of claim 22, further comprising:
   first bonding wires electrically connecting the plurality of stacked first memory chips to chip connection patterns of the package substrate;
   second bonding wires electrically connecting the plurality of stacked second memory chips and the topmost chip of the plurality of stacked first memory chips to the second through mold vias; and
   third bonding wires electrically connecting the memory controller to the first through mold vias.

24. The semiconductor package of claim 23, wherein the package substrate comprises:
   first chip connection patterns disposed to be adjacent to the first side of the stair structure of the plurality of stacked first memory chips, and connected to the first bonding wires;
   second chip connection patterns disposed to be adjacent to the second side of the stair structure of the plurality of stacked first memory semiconductor chips, and connected to the second through mold vias; and
   third chip connection patterns disposed to be adjacent to the first side of the stair structure of the plurality of stacked first memory semiconductor chips, and connected to the first through mold vias.

25. The semiconductor package of claim 24, wherein first and second chip connection patterns are electrically connected to the third chip connection patterns by internal conductive trace patterns disposed in the package substrate.

* * * * *